(12) United States Patent
Brewer et al.

(10) Patent No.: US 7,729,890 B2
(45) Date of Patent: Jun. 1, 2010

(54) METHOD FOR DETERMINING THE CHANGE OF A SIGNAL, AND AN APPARATUS INCLUDING A CIRCUIT ARRANGED TO IMPLEMENT THE METHOD

(75) Inventors: Robert John Brewer, Lambourn (GB); Michael C. W. Coln, Lexington, MA (US); Colin Gerard Lyden, Baltimore (IE); Alain V. Guery, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/725,261

(22) Filed: Mar. 19, 2007

(65) Prior Publication Data

US 2008/0052045 A1    Feb. 28, 2008

Related U.S. Application Data

(60) Provisional application No. 60/839,307, filed on Aug. 22, 2006.

(51) Int. Cl.
    *H04B 15/00*    (2006.01)
(52) U.S. Cl. .................................................. 702/199
(58) Field of Classification Search ................. 702/190, 702/194, 195, 64, 66, 127, 176, 179, 180, 702/189, 199; 708/445, 805, 806, 819
    See application file for complete search history.

(56) References Cited

U.S. PATENT DOCUMENTS

| 5,561,667 | A | 10/1996 | Gerlach |
| 6,262,943 | B1 * | 7/2001 | Clarke .......................... 367/135 |
| 6,452,996 | B1 * | 9/2002 | Hsieh ............................ 378/15 |
| 7,286,871 | B2 * | 10/2007 | Cohen .......................... 600/544 |
| 2005/0165879 | A1 * | 7/2005 | Nikitin et al. ................ 708/805 |

FOREIGN PATENT DOCUMENTS

| WO | WO 2004/034311 | | 4/2004 |
| WO | 2008/024327 | * | 2/2008 |

OTHER PUBLICATIONS

Baird, Rex T. et al, "Linearity enhancement of multibit $\Delta\Sigma$ A/D and D/A converters using data weighted averaging", IEEE Transactions on Circuits and Systems II: Analog and Digital Signal Processing, vol. 42, No. 12, Dec. 1995, pp. 753-762.
PCT/US2007/018450, search report and written opinion, Apr. 25, 2008.

* cited by examiner

*Primary Examiner*—Michael P Nghiem
(74) *Attorney, Agent, or Firm*—Knobbe Martens Olson & Bear LLP

(57) ABSTRACT

A method of estimating a change of a variable over a measurement window, including the steps of taking multiple samples of the variable during the measurement window, defining a weight to be associated with each sample, the weight varying as a function of position of the sample within the measurement window, processing the samples taking account of their weight to form an estimate of the change in the variable.

21 Claims, 8 Drawing Sheets

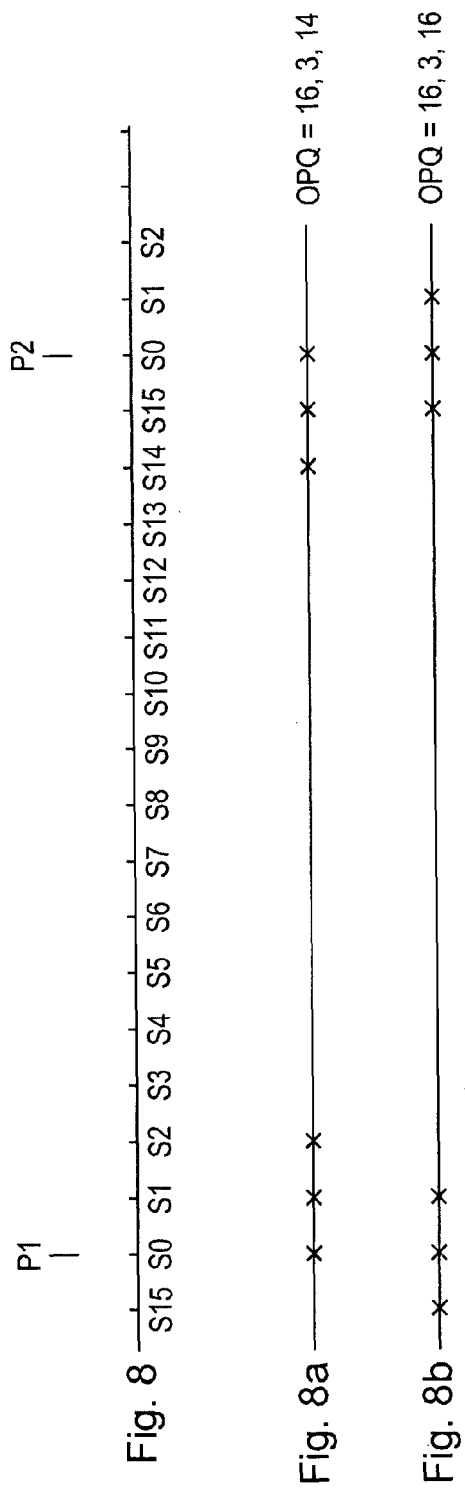

ns and an
METHOD FOR DETERMINING THE CHANGE OF A SIGNAL, AND AN APPARATUS INCLUDING A CIRCUIT ARRANGED TO IMPLEMENT THE METHOD This application claims benefit to provisional application 60/839,307 filed Aug. 22, 2006.

The present invention relates to a method of determining a change in a signal over a time period or the gradient of an over sampled signal, and to an apparatus including a circuit for determining the gradient or change of an over sampled signal.

BACKGROUND OF THE INVENTION

It is often desirable to be able to estimate the parameter, such as a current, by integrating the current over time. The slope of the integral represents an average value of a current. The average value is then digitised, for example by taking a sample at a first instant in time, taking a sample at a second instant in time, and subtracting the difference between the two values to obtain the difference, and hence infer a gradient during the sample period. Relying on one or two samples like this may render the measurements susceptible to noise. Whilst over sampling a signal can provide improvements in measurements of a parameter, the over sampling can give rise to a computational overhead.

SUMMARY OF THE INVENTION

According to the first aspect of the present invention there is provided a method of estimating a change of a variable over a measurement window, comprising the steps of:
a) taking multiple samples of the variable during the measurement window;
b) defining a weight to be associated with each sample, the weight varying as a function of position of the sample within the measurement window;
c) processing the samples taking account of their weight to form an estimate of the change in the variable.

According to a second aspect of the present invention there is provided an apparatus for estimating a change in a measurand during a measurement window, comprising the steps of:
a) taking multiple samples of the measurand during the measurement window, and
b) processing the sample values in accordance with a weight associated with each sample, said weight varying as a function of position of the sample within the measurement window.

It is thus possible to provide an improvement in the signal to noise ratio of the estimate of the variable/measurand whilst utilising a computationally simple technique which can be performed in dedicated hardware.

Where the length of the measurement window may vary in time, perhaps because the measurement window represents a "view" from a computerised tomography scanner and the scan head is subject to speed changes, then it may be necessary to take account of the fact that each of the samples are not equally spaced apart in time.

According to a third aspect of the present invention, there is provided a method of selecting samples for combination to form an estimate of a measurand, said samples occurring in a sequence, wherein a first parameter defines the length of a calculation window, a second parameter defines a number of measurements selected from opposing ends of the calculation window and a third parameter defines a separation between samples selected from the opposing ends of the calculation window.

BRIEF DESCRIPTION OF THE DRAWINGS

The present invention will further be described, by way of example only, with reference to the accompanying drawings, in which:

FIG. 8 includes FIGS. 8a and 8b which illustrate parameterisation schemes for the sample sequence.

DESCRIPTION OF PREFERRED EMBODIMENTS

Figure 1:
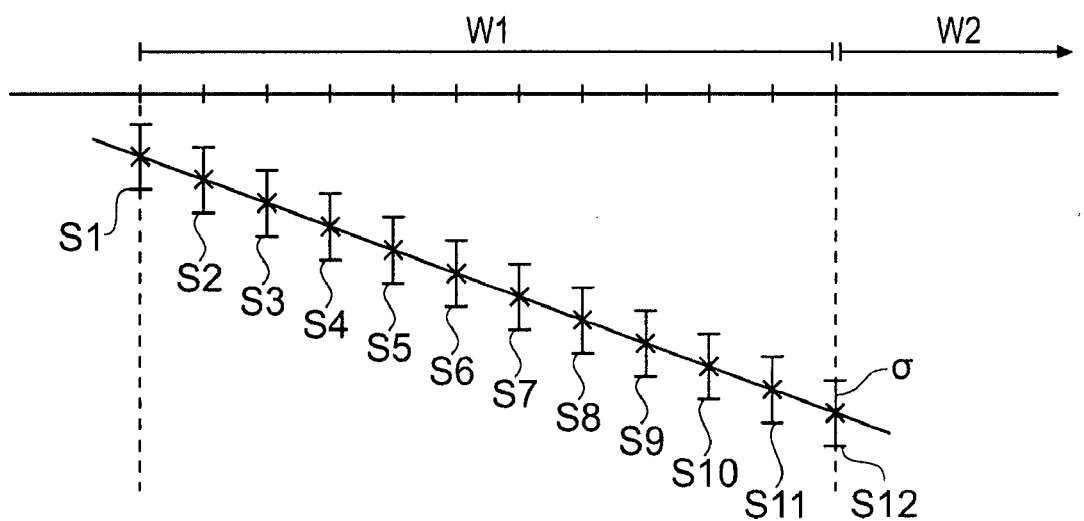
FIG. 1 schematically illustrates multiple samples for an over sampled signal within a sampling window W1.

Suppose that we have an ADC arranged to sample, at a regular sample rate such that we have series of measurements $(x_1, y_1), (x_2, y_2) \ldots (x_n, y_n)$ and where we further assume that each of the y values has a measurement error $\sigma_i$, but for simplicity we will assume each x value can be regarded as being error free.

If it is desired to fit the measurements to a straight line, as represented by $$y = a + bx$$

then a chi-squared function can be used where $$\chi^2(a, b) = \sum_{i=1}^{N} \left( \frac{x_i - a - bx_i}{\sigma_i} \right)^2$$

In the absence of measurement errors, the values of a and b can be estimated as the derivative with respect to these parameters can be minimised.

$$\frac{\delta \chi^2}{\delta a} = 0 = -2 \sum_{i}^{N} \frac{y_i - a - bx_i}{\sigma_i^2}$$

$$\frac{\delta \chi^2}{\delta b} = 0 = -2 \sum_{i=1}^{N} \frac{x_i(y_i - a - bx_i)}{\sigma_i^2}$$

It is then further known (see for example P662 of "Numerical recipes in C: the art of scientific computing", ISBN 0-521-43105-5)

that the following definitions can be made $$S = \sum_{i=1}^{N} \frac{1}{\sigma_i^2}$$

$$Sx = \sum_{i=1}^{N} \frac{x_i}{\sigma_i^2}$$

$$Sy = \sum_{i=1}^{N} \frac{y_i}{\sigma_i^2}$$

$$Sxx = \sum_{i=1}^{N} \frac{x_i^2}{\sigma_i^2}$$

$$Sxy = \sum_{i=1}^{N} \frac{x_i y_i}{\sigma_i^2}$$

Then if we let $$\Delta = SSxx - (Sx)^2$$

we get $$a = \frac{SxxSy - SxSxy}{\Delta}$$

$$b = \frac{SSxy - SxSy}{\Delta}$$

Suppose, for the sake of simplicity that we have 10 samples and that $\sigma_i$ is assumed to be a constant.

We see that:

calculation of S requires a multiplication, a division and 10 summations or a further multiplication. This value needs to be calculated only once if $\sigma$ can be assumed to be the same between measurement windows, calculations of Sx can be simplified if $$\frac{1}{\sigma_i^2}$$

is pre-calculated from the preceding calculation of S. If this is the case then we can simplify to 10 multiplications and 10 summations, calculation of Sy can similarly be simplified to 10 multiplications and 10 summations, calculation of Sxx can also be simplified to 20 multiplications and 10 summations, calculation of Sxy can also be simplified to 20 multiplications and 10 summations.

The calculations of $\Delta$ is a further two multiplications and 1 subtraction. Calculation of a and b are a further two multiplies, one subtraction and a division each.

Thus, to estimate the values a and b from ten samples requires 50 summations, 67 multiplies, 3 divisions and 3 subtractions. Even if we only want the gradient b, we see that we still have to calculate S, Sx, Sy, Sxx and Sxy so there is virtually no saving in processing power.

Furthermore even if $$\frac{1}{\sigma^2}$$

is simplified to equal unity then the estimation of b still involves 50 summations and over 20 multiplications. This is computationally expensive and also requires numerous memories to hold intermediate values. This is not appropriate for use in systems working in real time with large numbers of parallel data streams.

In the absence of noise then there would be effectively no measurement error (except quantisation error) and it would be acceptable merely to take two measurements and to subtract one from the other, thereby avoiding, potentially, the overhead of the least squares approach described hereinbefore.

However, in the presence of noise the result of such a simple process can result in an error.

Consider FIG. 1. Here a sample window, $W_1$, exists in which a plurality of samples, in this instance $S_1$ to $S_{12}$, have been taken. Each sample has an error $\sigma$ such that there is a statistical probability that each sample is within $\pm\sigma$ from its nominal value (typically 95% of samples satisfy this condition).

The inventors have noted that other factors affect the error in a gradient calculation. If we now consider FIGS. 2a and 2b we see that the error in the final result, i.e. the gradient of the line of the difference between the start and end values, depends not only on the individual error in the measurements but also the distance between the measurement points.

Figure 2A:
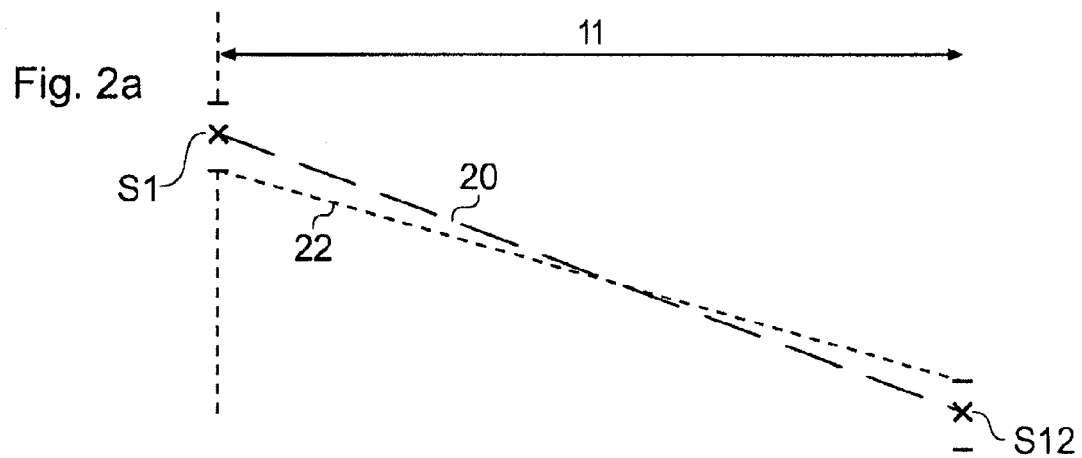
FIGS. 2a and 2b schematically illustrate the calculation of gradient between sample S1 and S12, and S1 and S8, respectively, within the samples of FIG. 1 together with the effect on calculation of errors within the gradient.

FIG. 2a compares samples $S_1$ and $S_{12}$. These samples are separated by 11 units in the x axis (which may represent time or distance or amount of rotation).

Thus the gradient, as represented by chain line 20 is $$b = \frac{S_1 - S_{12}}{11}$$

however, errors associated with the measurements could mean that the true gradient b' could or should have been represented by the dotted line 22

$$b' = \frac{(S_1 - \sigma) - (S_{12} + \sigma)}{11}$$

∴ the difference or error in the gradient could be $$\Delta b = \frac{2\sigma}{11} = 0.1818\sigma$$

Figure 2B:
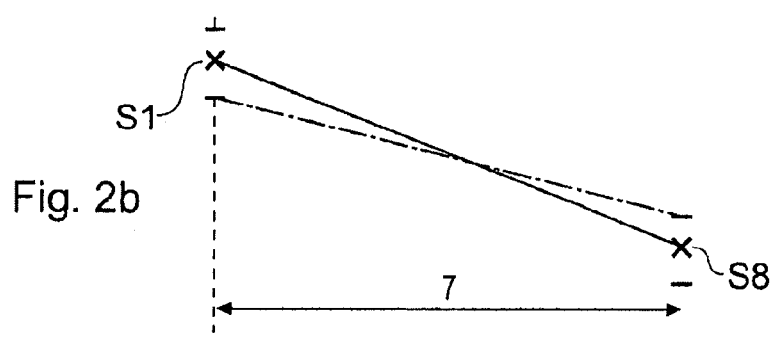

Similar considerations apply in FIG. 2b $$b = \frac{S_1 - S_8}{7} = \frac{S_1 - S_{12}}{11}$$

$$b' = \frac{(S_1 - \sigma) - (S_8 + \sigma)}{7}$$

so $$\Delta b = \frac{2\sigma}{7} = 0.2857\sigma$$

Therefore the estimate of the gradient is subject to more uncertainty as represented by Δb as the "distance" between measurements decreases.

However, it is known that the effects of noise can be reduced by taking multiple samples of a signal as the signal power increases linearly with the number of samples taken whereas noise power for Gaussian noise increases as the square root of the number of samples taken.

Taking multiple samples at points $S_1$ and $S_{12}$ may not be possible due to acquisition constraints, but taking multiple samples within the measurement window is.

However, the samples need to be processed in a computationally simple way. The inventors have realised that acceptable estimates of the gradient can be obtained by mere addition and subtraction of the sample values—subject to the sample values being modified by a weighting function.

Figure 3:
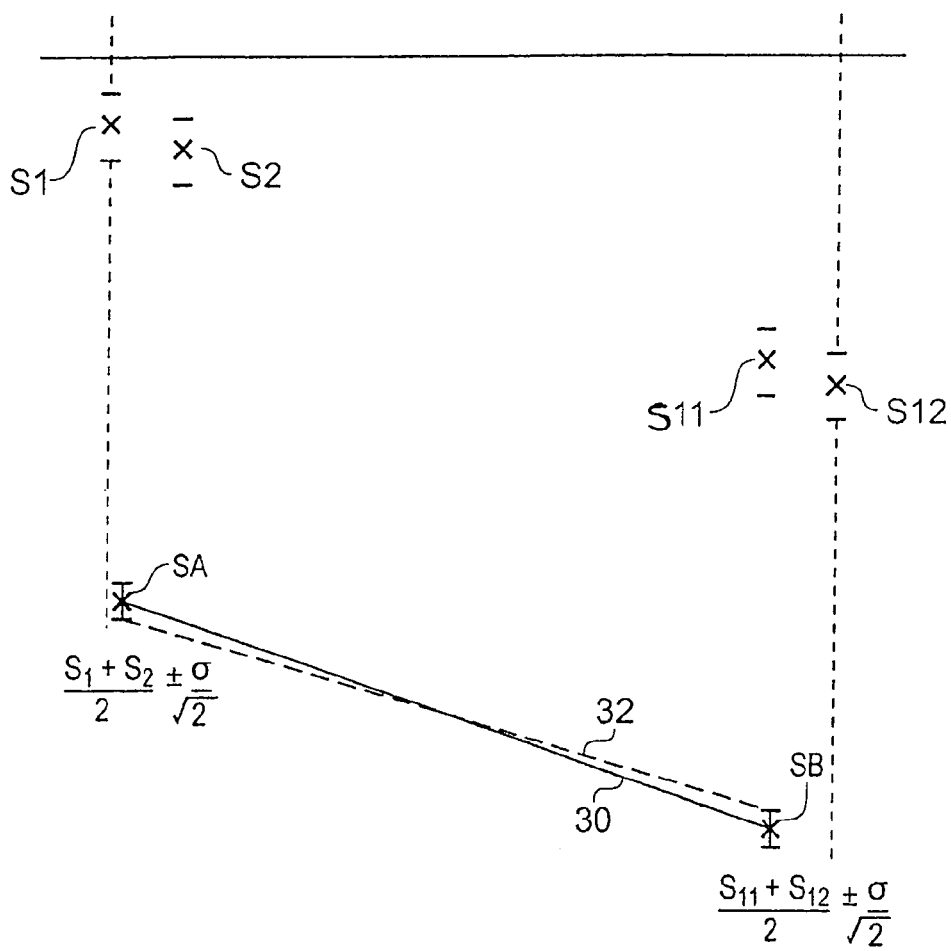
FIG. 3 schematically illustrates the effect of sub-selecting from the samples in order to calculate average sample values.

If we consider FIG. 3, the values $S_1$, $S_2$, $S_{11}$, and $S_{12}$ have been taken for processing.

$S_1$ and $S_2$ can be averaged to give a new sample SA which can be regarded as being at $$x \text{ co-ordinate} = \frac{1}{2}, \; y \text{ co-ordinate} = \frac{S_1 + S_2}{2}, \text{ i.e. } \frac{x_1 + x_2}{2}, \frac{y_1 + y_2}{2}.$$

Similarly $S_{11}$ and $S_{12}$ can be averaged to give a new sample SB which can be regarded as being $$x = 10.5, \; y = \frac{S_{11} + S_{12}}{2}, \text{ i.e. } \left(\frac{x_{11} + x_{12}}{2}, \frac{y_{11} + y_{12}}{2}\right).$$

$$\therefore \text{ gradient } b = SB - SA = \frac{\frac{S_{11} + S_{12}}{2} - \frac{(S_1 + S_2)}{2}}{10.5 - 0.5}.$$

The gradient calculation will be the same as calculated in FIGS. 2a and 2b, and is represented by solid line 30.

If we now consider the effect of the errors σ has reduced by $$\frac{\sqrt{2}}{2},$$

but the distance between the composite samples SA and SB has reduced from 11 in the case of FIG. 2a to 10.

$$\Delta b = \frac{\sqrt{2}\sigma}{2 \cdot 10} = 0.0707\sigma$$

If we now include $S_1$, $S_2$, $S_3$ and $S_{10}$, $S_{11}$, $S_{12}$ then the value of σ reduces to $$\frac{\sqrt{3}}{3}$$

and the effective distance reduces to 9 units $$\therefore \Delta b = \frac{\sqrt{3}}{3} \times \frac{\sigma}{9} = 0.06415\sigma$$

If we now include $S_1$, $S_2$, $S_3$ and $S_4$ against $S_9$, $S_{10}$, $S_{11}$, $S_{12}$ then the value of σ reduces to $$\frac{\sqrt{4}}{4}$$

and the effective distance reduces to 8, so $$\Delta b = \frac{\sqrt{4}}{4} \times \frac{\sigma}{8} = 0.0625\sigma$$

If we now include $S_1$, $S_2$, $S_3$, $S_4$, $S_5$ and $S_8$, $S_9$, $S_{10}$, $S_{11}$, and $S_{12}$ then the value of σ reduces by $$\frac{\sqrt{5}}{5}$$

and the effective distance reduces to 7, so $$\Delta b = \frac{\sqrt{5}}{5} \times \frac{\sigma}{7} = 0.0639\sigma$$

It can be seen that even though more samples have been included, the error on the gradient has increased compared to the case of using four samples in each set of samples.

If we pair of all samples into $S_1$ to $S_6$ and $S_7$ to $S_{12}$ then on each composite sample the error has reduced by $$\frac{\sqrt{6}}{6}$$

and the effective distance between the composite sample is 6 so $$\Delta b = \frac{\sqrt{6}}{6} \times \frac{\sigma}{6} = 0.0680\sigma$$

Which is worse than only using $S_1$, $S_2$, $S_3$ and $S_{10}$, $S_{11}$, and $S_{12}$.

This demonstrates the surprising result that using more of the samples can degrade the estimate of the gradient.

The inventors, having realised this, propose that the contribution of the various readings should be weighted, such that the contributions from some of the samples can be ignored.

The weighting occurs in both X and Y directions such that the position of the composite sample points reflects the relative contribution of each of the samples to it.

In high through-put digital systems it is beneficial for the weighting function to be easy to implement. A particularly easy weighting function to implement is shown in FIG. 4b where the weighting function either has a value of 0 or a value of 1. In the example shown in FIG. 4b the weighting function has a value of 1 for samples $S_1$, $S_2$, $S_3$, and $S_{10}$, $S_{11}$, and $S_{12}$. For all other samples awaiting function has a value of 0. The weighting function is symmetric around the mid-point of the sampling window. This function can be implemented entirely in hardware using an adder to keep a running total of the value of the samples. Thus, for a single channel, a hardware adder can be initialised at the start of the window, and then as time progresses through the window can sum $S_1$, $S_2$ and $S_3$. The hardware adder then ignores samples $S_4$ to $S_9$ and is then set to a decrement mode such that as sample $S_{10}$ arrives it decrements it from the currently held sum of $S_1$, $S_2$ and $S_3$. Subsequently as sample $S_{11}$ occurs this is also decremented from the current total and finally as sample $S_{12}$ occurs this is also decremented. The output of the hardware summer then represents a scaled estimate of the gradient. In this example, the value in the hardware summer would represent the gradient measured effectively between $S_2$ and $S_{11}$. The output then needs scaling, for example by a digital multiplication by a constant, to rescale the output to that which would have occurred when subtracting $S_{12}$ from $S_1$. This value can then be passed to downstream processing circuits which had been expecting a single value corresponding to merely subtracting $S_{12}$ from $S_1$. Thus an improvement in the signal to noise performance has been obtained while maintaining compatibility with older data processing systems.

The weighting function shown in FIG. 4b is particularly simple to implement and also lends itself to being parameterised by a single value representing the extent of the 0 period, either in totality, or measured from the mid-point of the window. In one example for parameterising the function shown in FIG. 4b, the function can be represented by $$Fn_i(A,B)$$

where A represents the number of samples that are taken in a measurement window and B represents the number of samples that occur in a first portion 41 (which may also be regarded as a sample set) where a non-zero weight is applied. From this parameterisation the hardware or system can deduce the existence of a second portion 42 within the measurement window where a non-zero weighting is applied. As will be shown later, this parameterisation scheme can be extended.

The parameterisation allows the weighting function to be modified rapidly if a controller determines that a different weighting/result combining function is required. The weighting signal can be readily regenerated using a counter to count the samples as they occur and to decide on the basis of the control parameter whether the samples are to be multiplied by 1 or to be discarded for the purposes of calculating the gradient.

More complex gradients may also be used and that shown in FIG. 4c represents a step wise function where again a central portion of the function is zero valued but where samples towards the end of the function are given different weightings. The function shown in FIG. 4c weights samples $S_1$ and $S_{12}$ by twice the values of samples $S_2$ and $S_{11}$. All other samples $S_3$ to $S_{10}$ are 0 weighted. It can be seen that the effective X position of the composite samples would occur ⅓ of the way between $S_1$ and $S_2$ and ⅓ of the way between $S_{12}$ and $S_{11}$, namely with X values of ⅓ and 10.67 respectively in the example shown here.

FIG. 4d shows a further variation in which a linear function, which can be replicated to the digital domain by a staircase, extends in either direction from the mid-point of the window. Finally FIG. 4e shows a smoothly varying function centred around the mid-point of the window. A generally parabolic function would be easy to implement within the digital domain as the scaling of ÷2, ÷4, ÷8 and so on could be accomplished merely by shifting the digital word from the analog to digital converter by 1, 2, 3 and so on bits towards the least significant bit.

Figure 5:
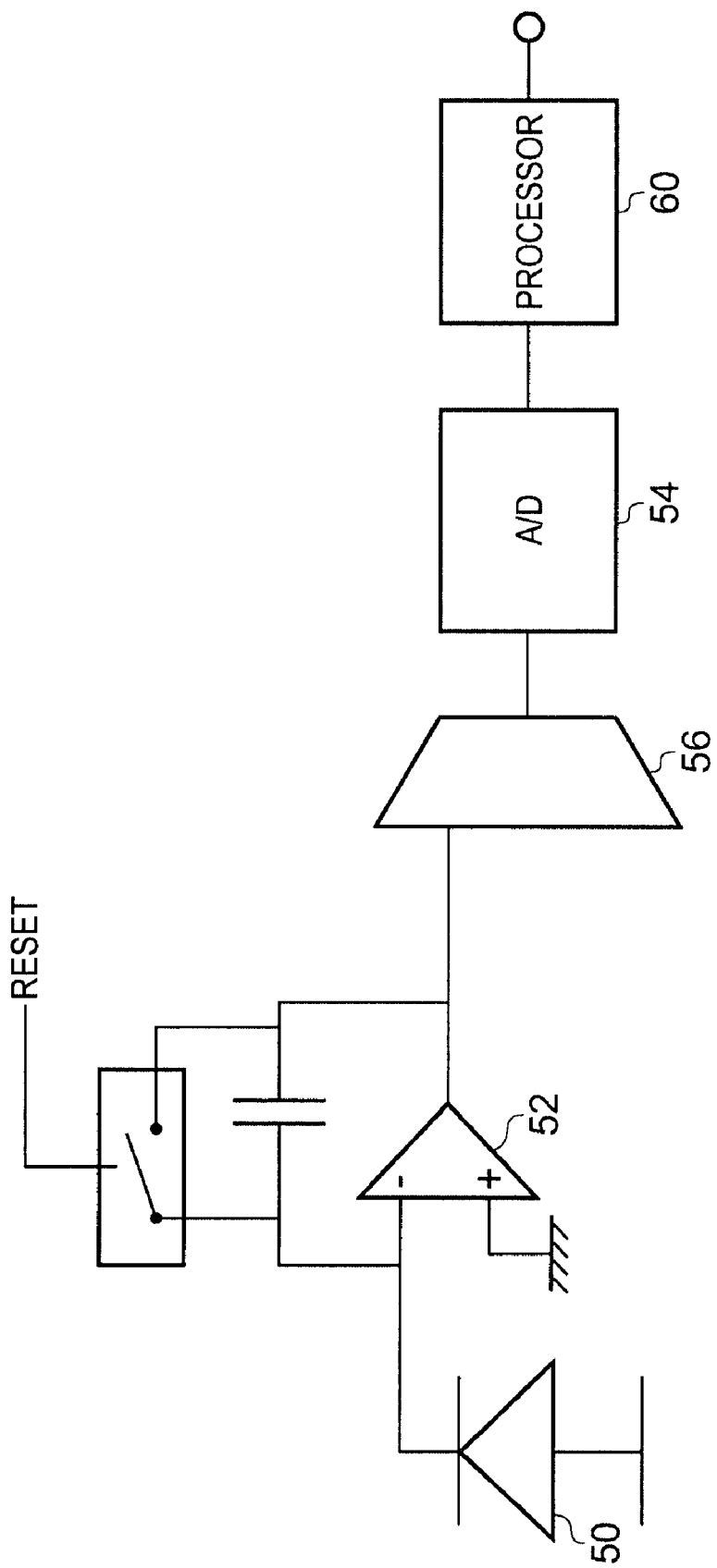
FIG. 5 schematically illustrates an apparatus including a processor adapted to implement the method of the present invention.
Figure 6:
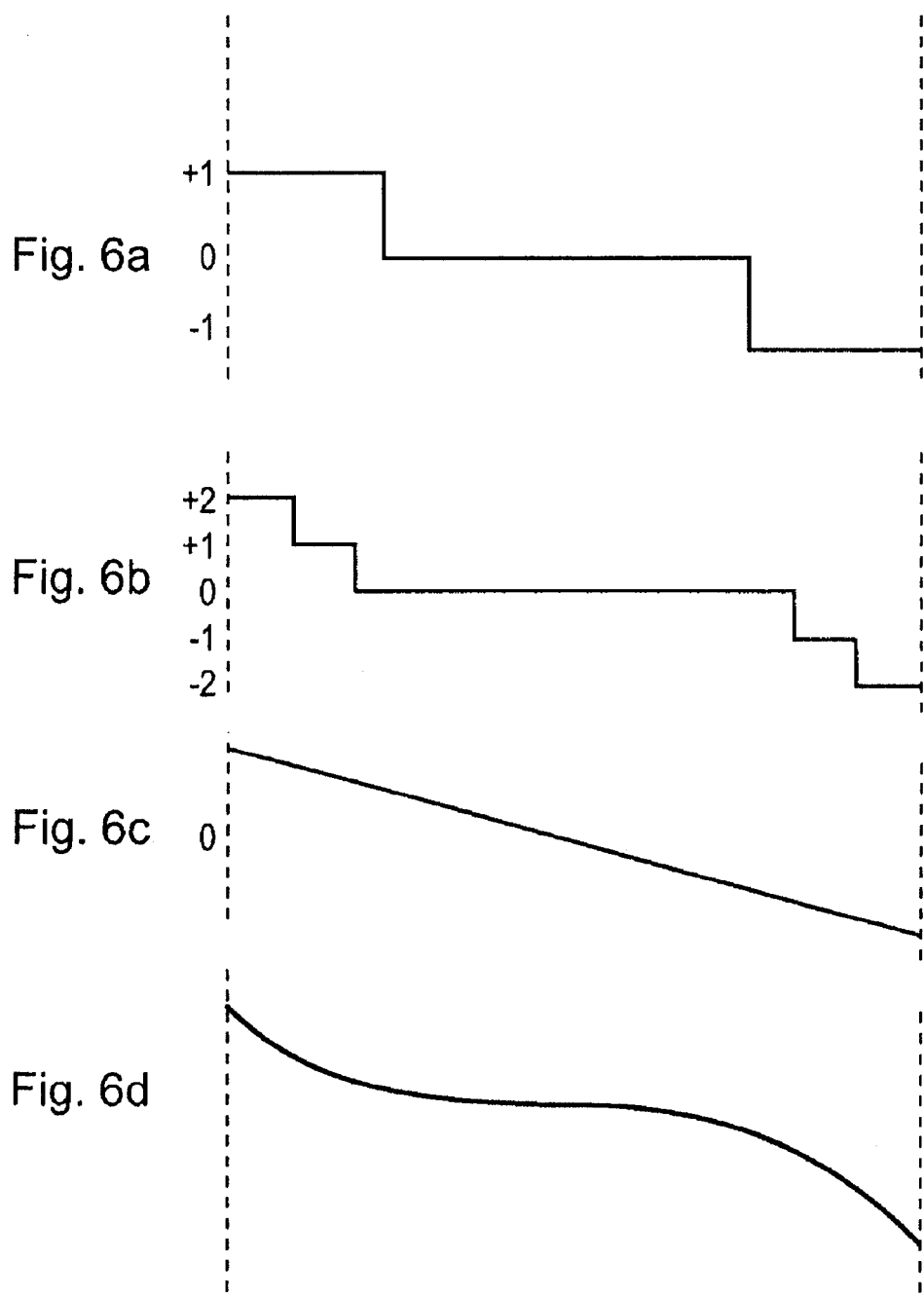
FIG. 6a to 6d show alternative representations of the weighting functions shown in FIGS. 4b to 4e.

FIG. 5 schematically illustrates a measurement circuit including a processor adapted to implement the present invention. The measurement circuit may, for example, be a channel within a x-ray computerised tomography (CT) scanner. Typically a CT scanner has a scintillation crystal (not shown) in association with a photo diode array. The photo diode array typically comprises a large number such as 64 or 128, photo diodes. FIG. 5 schematically illustrates one such photo diode 50. In use the current from the photo diode 50 is integrated by an integrator 52 such that an estimate of the current flowing through the diode in the measurement window can be obtained. In prior art CT scanners a reset circuit is associated with the integrator 52 and is operated at the beginning of each measurement window such that only one sample, corresponding to sample $S_{12}$ of FIG. 1 need be taken at the end of each measurement window and that the value of $S_{12}$ was directly related to the current through the photo diode 50. However noise effecting the reset voltage and the single measurement of sample $S_{12}$ gives rise to the potential to miscalculate the gradient with the measurement window.

In the present invention, the output of the integrator 52 is provided to an analog to digital converter 54 by way of a multiplexer 56. The multiplexer allows signals from several, for example 64 or 128, photodiodes to be sent to a single analog to digital converter in time multiplexed fashion. For simplicity, we need only consider what occurs in a single one of the channels.

Figure 4:
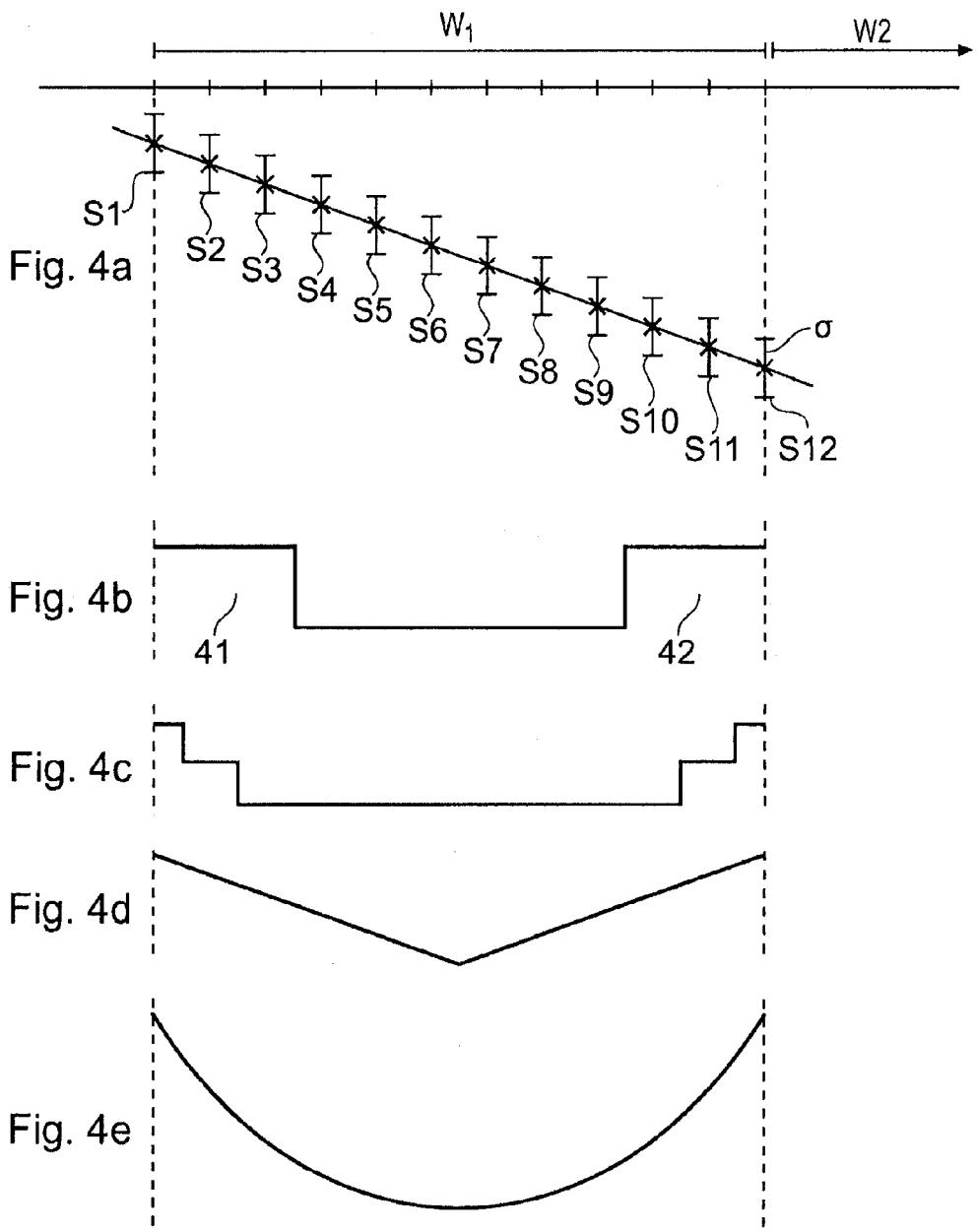
FIG. 4a reproduces the plot of over samples from FIG. 1 and FIG. 4b to 4e show examples of weighting functions to be applied within the sample window W.

As noted with respect to FIGS. 1 and 4 the output from the integrator 52 is over sampled so that a plurality of samples are taken within a single measurement window W. Although FIG. 1 has shown 12 such samples as being taken, this is only an exemplary number and the number of samples could typically range between 8 and 20. The output from the analog to digital converter is provided to a processor 60. Typically the analog to digital converter might provide a conversion result every 300 to 350 nanoseconds or so. The processor 60 needs to work in real time in order to process the samples from each channel such that the channel outputs from each and every channel within the array can be made available at the end of every sampling window which might be in the range of 100 to 300 microseconds. In order to do this in a time efficient manner the processor accumulates in hardware a running total of the value for each channel and stores it to a channel memory. It is known to the person skilled in the art that memory occupies a relatively large volume on a silicon die compared to other components and it is therefore advantageous to keep the amount of memory required down to a minimum. The present invention keeps a running total for each channel and therefore requires only one memory per channel, the memory typically having the same number of bits as the analog to digital converter 54 plus potentially a couple of other bits to avoid memory overflow when forming the running total. Thus, for each channel, the processor takes the result stored in the memory of that channel and adds or subtracts the current sample value to it as appropriate. Thus each channel only requires a single memory to be associated with it. For a converter having, say, a 16 bit output each channel memory need only be a maximum of 18 bits wide. The invention, when implemented with the weighting function shown in FIG. 4b, only requires three additions, three subtractions and optionally one multiplication for rescaling purposes to be performed for each channel in order to obtain an estimate of the gradient having improved immunity to noise when compared with the prior art.

The other functions are also describable in parameterised form or alternatively may be stored in a look-up table for use by the processor 60.

In some embodiments of the present invention the integrator is only reset when it gets close to the limits of its operation. A reset might occur during the measurement window thus, if a reset occurred between sample 6 and sample 7 then samples 7 to 12 would be offset from sample 6 by the size of the reset. This can be accommodated by storing a value for the integrator output value immediately following a reset and then adding a further offset representing the difference between the last sample value and the reset value to each of the subsequently sampled values for the remainder of the sample window.

In FIG. 4b to 4e the graphs represent the magnitude of the weighting factor—but the sign is implied from the position of a sample within the measurement window. The same weighting functions can be expressed to make the sign (add or subtract) of the weight explicit, as shown in FIGS. 6a to 6d. It can be seen that the weight varies monotonically within a window.

It is thus possible to provide a method of calculating the gradient for an over sampled signal which is computationally fast and simple to do in hardware.

So far we have assumed that the samples occur at equal separations in time within the measurement window. However, in the context of a computerised tomography scanner the scanning head is very heavy and is mechanically driven. Consequently the rate of rotation of the scanning head can vary. It is therefore desirable in order to trigger the over sampling from synchronisation pulses which occur when the scanning head has reached predetermined positions. Each synchronisation pulse marks the end of one measurement window and the beginning of the next. Given that the rate of rotation of the scanning head is reasonably well known, it is possible to set the rate of over sampling to ensure that all of the samples are taken within the measurement window. Nevertheless, it can be observed that the time period between the final over sampled sample, and the next sample which coincides with the synchronisation pulse could, and indeed almost certainly will, have a time period which is greater than the inter-sample time period for any of the other samples within the measurement window. The length of this period is the sum of the inter sample period and a stretch time.

Figure 7:
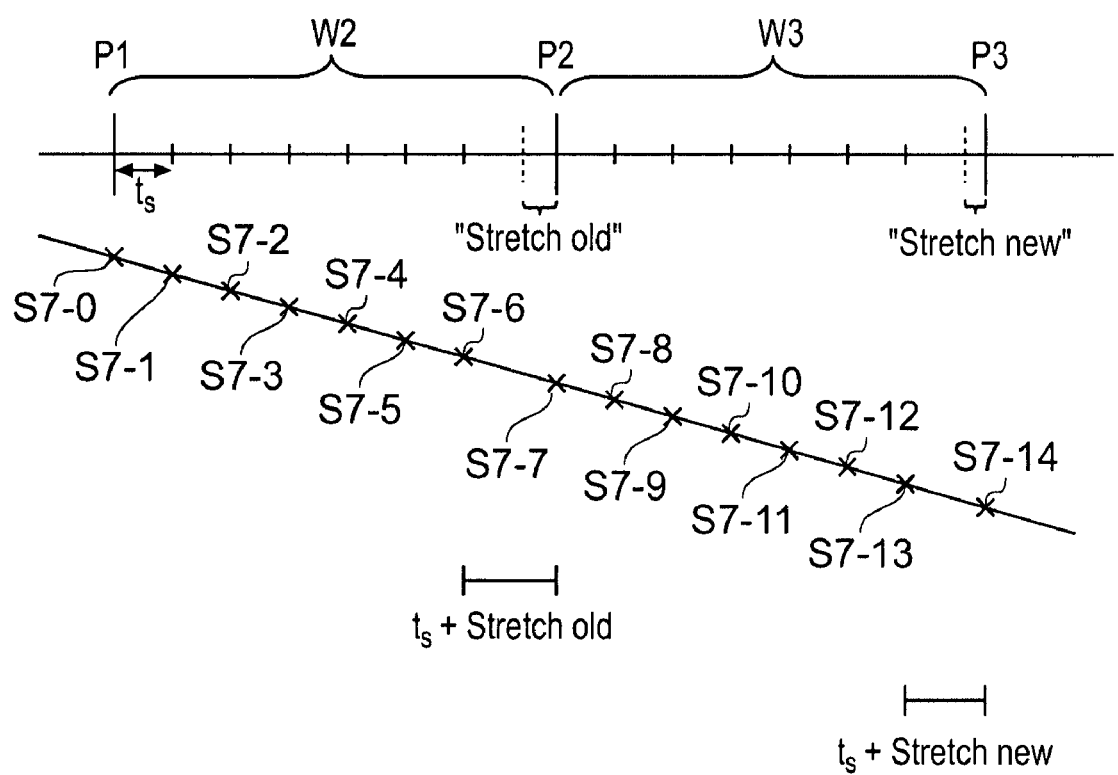
FIG. 7 illustrates a sample sequence where a stretching of the inter-sample time period has occurred for the last sample within each measurement window.

This can be seen more clearly in FIG. 7 which shows the three synchronisation pulses P1, P2 and P3 defining measurement windows W2 and W3 between them. For simplicity we shall assume that only eight samples are used within each measurement window, with the samples designated S7-0 to S7-14 within FIG. 7. S7-0 is coincident with the first trigger pulse P1 and from then on samples occur every $t_s$ seconds up to sample S7-6 which is the last sample to occur before synchronisation pulse P2. Thus, if we regard P1 as defining time t=0, then S7-1 occurs at $t=t_s$, S7-2 occurs at $t=2t_s$ and S7-6 occurs at $t=6t_s$. Sample S7-7 can be seen to be separated from sample S7-6 by more than the normal sampling period $t_s$. Sample S7-7 occurs at $t=7t_s$+stretch old, where "stretch old" represents the additional time by which the sample period between S7-6 and S7-7 had been extended. Sample S7-7 can be regarded as representing a sample at the end of measurement window W2 and also commencing the start of measurement window W3. Following the occurrence of sample S7-7 the samples are again taken at regular time periods separated by $t_s$ until sample S7-13 occurs which is the last sampling instance before the synchronisation pulse P3. Once again there is a larger separation between sample S7-13 and sample S7-14 than between any of the other samples occurring within measurement window W3. The sample periods can be regarded as being stretched, and for any given measurement window, especially window W3 we can define two stretch periods with the period preceding the synchronisation pulse P2 being "stretch old" and the stretch period occurring within the window W3 and immediately preceding the synchronisation pulse P3 as being "stretch new".

The calculation of the gradient can then be modified to take account of the stretch periods.

This calculation can itself also be parameterised.

First, second and third parameters can be used to describe the process for calculating the gradient. These have been given labels O, P and Q.

O represents the number of samples within a sample window, or a repeat length defining the distance between similar points in consecutive calculation windows.

P indicates the number of samples that will be selected from the beginning and end of the sample window, and Q represents the "distance" between samples which were paired off as part of the gradient calculation process.

This can be seen more easily in FIG. 8 where within each measurement window, as defined as the period between synchronisation pulse P1 and synchronisation pulse P2 we take samples S0 to S15. For simplicity in this example, the pulse occurring in synchronism with each synchronisation pulse is labelled S0. Thus each sample window has sixteen samples in it, therefore O=16. We are using the first three samples and the last three samples so P=3. We effectively form three sample pairs with each pair being separated by fourteen samples so Q=14. Thus the sample pairs S0 and S14, S1 and S15, S2 and S0 (from the next window). As we form (S0−S14)+(S1−S15)+(S2−S0*).

where "*" indicates that S0 comes from the next sample window, i.e. it follows S15 in FIG. 8.

The result of this calculation is then scaled or normalised in order to give the gradient. It should be noted that this parameterisation scheme can be extended, as shown in FIG. 8b which shows the sample pairs used for parameterisation O, P, Q=16, 3, 16. It can be seen that the samples remain symmetrically disposed around the mid-point of the measurement window. In such a circumstance it is useful to consider O as defining the length between similar points in consecutive calculation windows.

Where we use samples from the preceding view then the algorithm needs to accommodate the "stretch old", when we have the stretch preceding the first synchronisation pulse of the current view. If the gradient is calculated as described hereinbefore, that is just by forming running sums, then the normalisation factor needs to be modified to take into account the stretches that occur between some of the sample points. The normalisation factor F can be defined as:

$$F = \frac{O.sub + \text{"stretch\_new"}}{(P.Q. \text{ sub}) + \left(\left((Q+P-O)/2 - \frac{1}{2}\right)\text{"stretch\_old"}\right) + \left(\left((Q+P-O)/2 + \frac{1}{2}\right)\text{"stretch\_new"}\right)}$$

Where "sub" represents the time separation between data samples in the same units as the values "stretch old" and "stretch new". The above formula works where the samples are selected to be symmetrically disposed around the window mid-point.

This normalisation factor applies in the case where:
the weighting factor applied to the data samples has values of only one or zero and the factor is correct for the constant slope (zero order curvature correction).

It is useful to consider two examples to illustrate how the normalisation factor varies.

Suppose that we sample every 300 nS, and that the conversion window has 16 samples, that the number of samples used at the beginning and end of each range is 3, and that the distance between paired off samples is 14.

Thus
O.sub=300 nS
O=16
P=3
Q=14
If no stretching occurs at all then we have $$(Q + P - O)/2 = \frac{1}{2}$$

so $$F = \frac{300\,nS}{3.300\,nS + \left(\frac{1}{2} - \frac{1}{2}\right).0 + \left(\frac{1}{2} + \frac{1}{2}\right).0} = 1/3$$

Which intuitively is correct as three sample pairs were used in place of one pair and no stretching occurred.

If a stretching of 150 nS (i.e. half a sample period) occurs consistently at the end of each sample window, then in this example we see that the S2 to S0* sample is too long.

$$F = \frac{(300 + 150)\,nS}{(3 \times 300\,nS) + \left(\frac{1}{2} - \frac{1}{2}\right) + \left(\frac{1}{2} + \frac{1}{2}\right).150\,nS}$$

$$F = \frac{450}{1050}$$

$$F = 0.428$$

The value of the scaling factor has gone up because two of the sample pairs are effectively under weight compared to the final sample pair (the one including the stretch time) and hence a longer weighting factor is appropriate.

The formula also works in the case illustrated in FIG. 8b where samples come from the neighbouring measurement windows, and under these circumstances it becomes necessary to take account of fact that "stretch old" and "stretch new" can take different values.

The value in the channel memory is then multiplied by the factor F to rescale the result.

Other normalisation factors can be used where the weighting factors differ or where the curvature is non zero.

The invention claimed is:

1. A method of estimating a change of an integrator output variable over a measurement window, comprising the steps of:
   a) taking multiple samples of the integrator output variable during the measurement window;
   b) using a processor to define a weight to be associated with each sample, each weight being a predetermined function of position of the associated sample within the measurement window, said weights having a larger magnitude towards the edges of the measurement window than at a central region of the window, and said weights being used to modify the associated sample;
   c) processing the samples taking account of their weights to form an estimate of the change in the variable; wherein the measurement window is sub-divided into a first portion and a second portion, and wherein a difference is formed between at least one sample in the first portion and at least one sample in the second portion.

2. A method as claimed in claim 1, in which samples from the first portion are paired with samples from the second portion to form estimates of a change in a variable and at least two estimates are averaged.

3. A method as claimed in claim 1, in which the samples are weighted according to their respective weights and a first plurality of weighted samples are combined to form a first average measurement and a second plurality of weighted samples are combined to form a second averaged measurement and the change in a variable is estimated using the first and second averaged measurements.

4. A method as claimed in claim 3, in which the change in the variable is estimated from a difference between the first and second averaged measurements.

5. A method as claimed in claim 4, in which an estimate of a rate of change of the variable further takes account of a spatial or temporal separation between the averaged measurements.

6. A method as claimed in claim 1, in which the weighting has magnitudes of either 1 or 0.

7. A method as claimed in claim 1, in which a weighting varies monotonically as a function of position within the measurement window.

8. A method as claimed in claim 1, wherein within a measurement window a running total of samples, as modified by their respective weights, is formed.

9. A method as claimed in claim 1, in which samples are paired, and the processing takes account of a separation between samples in each pair.

10. A method as claimed in claim 1, in which the samples within the measurement window are selected according to a plurality of parameters, where a first parameter represents the number of samples within a measurement window, a second parameter represents the number of samples selected from each end of the measurement window, and a third parameter represents the separation between samples that are paired off.

11. A method as claimed in claim 1, in which one or more of the samples are obtained from an integrator in a computerized tomography scanner, and taking of samples is triggered by external events such that the one or more samples are taken at a different separation from a preceding sample than otherwise expected, and wherein the method takes the change in separation into account.

12. A method as claimed in claim 1 where a scaling factor is calculated, said scaling factor being a function of the number of sample pairs used, and the separation between sample pairs.

13. A method as claimed in claim 12, in which the scaling factor is modified in response to samples occurring at modified instances from the expected inter-sample separation.

14. An apparatus for estimating a change in a measurand during a measurement window, comprising:
   a) an analog-to-digital converter for taking multiple samples of the measurand during the measurement window, and b) a processor for processing the sample values in accordance with a weight associated with each sample, each weight being a predetermined function of position of the associated sample within the measurement window, said weights having a larger magnitude towards the edges of the measurement window than at the center thereof in which the measurement window is subdivided into a first portion and a second portion, and within a measurement window the processor maintains a running total of the sample values, as modified by their weights, and wherein samples within the first measurement window portion are added to the running total and samples within the second measurement window portion are subtracted from the running total or vice versa.

15. An apparatus as claimed in claim 14, in which the weights vary as a function of position within the measurement window in a monotonic manner.

16. An apparatus as claimed in claim 15, wherein the way in which the weights vary is described in parameterised form.

17. An apparatus as claimed in claim 14, in which the measurand is an output of an integrator.

18. An apparatus as claimed in claim 14, in combination with a computerised Tomography scanner, wherein the apparatus is arranged to sample an integrated measurement of a current within a detector and to provide an output representative of the current in each measurement window.

19. An apparatus as claimed in claim 18, further arranged to compensate for irregular sampling of the samples.

20. An apparatus as claimed in claim 14 wherein the apparatus is arranged to select samples for combining based on a first parameter describing the number of samples that occur in each measurement window, a second parameter that describes the number of samples to be included within a first sample set and the number of samples to be included within a second sample set, and a third parameter which describes a separation between the sample sets.

21. An apparatus for estimating a change in a measurand during a measurement window, comprising:
   a) an analog-to-digital converter for taking multiple samples of the measurand during the measurement window, and
   b) a processor for processing the sample values in accordance with a weight associated with each sample, each weight being a predetermined function of position of the associated sample within the measurement window, said weights having a larger magnitude towards the edges of the measurement window than at the center thereof, wherein the apparatus is arranged to select samples for combining based on a first parameter describing the number of samples that occur in each measurement window, a second parameter that describes the number of samples to be included within a first sample set and the number of samples to be included within a second sample set, and a third parameter which describes a separation between the sample sets.

* * * * *